(12) United States Patent
Teramoto et al.

(10) Patent No.: US 11,476,143 B2
(45) Date of Patent: Oct. 18, 2022

(54) SUBSTRATE PROCESSING APPARATUS AND SUBSTRATE RECEPTACLE STORAGE METHOD

(71) Applicant: Tokyo Electron Limited, Tokyo (JP)

(72) Inventors: Akihiro Teramoto, Koshi (JP); Tatsuhiko Tsujihashi, Koshi (JP); Kousei Ide, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 6 days.

(21) Appl. No.: 17/089,814

(22) Filed: Nov. 5, 2020

(65) Prior Publication Data
US 2021/0134636 A1 May 6, 2021

(30) Foreign Application Priority Data
Nov. 6, 2019 (JP) ............................. JP2019-201347

(51) Int. Cl.
*H01L 21/677* (2006.01)

(52) U.S. Cl.
CPC .. *H01L 21/67769* (2013.01); *H01L 21/67715* (2013.01); *H01L 21/67733* (2013.01); *H01L 21/67766* (2013.01); *H01L 21/67775* (2013.01)

(58) Field of Classification Search
CPC ......... H01L 21/67733; H01L 21/67769; H01L 21/67715; H01L 21/67766; H01L 21/67775; H01L 21/67718; H01L 21/67736; H01L 21/6773; H01L 21/67763
See application file for complete search history.

(56) References Cited

U.S. PATENT DOCUMENTS

| | | | |
|---|---|---|---|
| 2009/0053665 A1* | 2/2009 | Haraki | H01L 21/67109 432/1 |
| 2014/0356106 A1* | 12/2014 | Kamikawa | H01L 21/687 414/222.13 |
| 2016/0273836 A1* | 9/2016 | Obara | F27D 3/0084 |
| 2018/0166310 A1* | 6/2018 | Onzuka | H01L 21/681 |
| 2018/0174877 A1* | 6/2018 | Ito | C23C 16/45527 |

FOREIGN PATENT DOCUMENTS

JP 2009-010287 A 1/2009

* cited by examiner

*Primary Examiner* — Glenn F Myers
(74) *Attorney, Agent, or Firm* — Pearne & Gordon LLP

(57) ABSTRACT

A substrate processing apparatus configured to process a substrate includes a substrate receptacle placing unit configured to place thereon a substrate receptacle accommodating therein the substrate to be processed; and a storage zone provided adjacent to the substrate receptacle placing unit to store therein the substrate receptacle. The storage zone includes multiple storages which are vertically arranged in multiple levels and configured to place and store thereon the multiple substrate receptacles horizontally. The substrate receptacle is transferred between a first storage of the multiple storages at an uppermost position and a ceiling travelling vehicle configured to be moved above the substrate processing apparatus. A second storage of the multiple storages under the first storage is configured to place and store the substrate receptacle thereon such that a direction of the substrate receptacle on the second storage is different from a direction of the substrate receptacle on the first storage.

12 Claims, 5 Drawing Sheets

SUBSTRATE PROCESSING APPARATUS AND SUBSTRATE RECEPTACLE STORAGE METHOD

CROSS-REFERENCE TO RELATED APPLICATION

This application claims the benefit of Japanese Patent Application No. 2019-201347 filed on Nov. 6, 2019, the entire disclosure of which is incorporated herein by reference.

TECHNICAL FIELD

The various aspects and embodiments described herein pertain generally to a substrate processing apparatus and a substrate receptacle storage method.

BACKGROUND

Patent Document 1 discloses a substrate processing system. In this substrate processing system, a cassette standby block in which multiple cassettes to be carried into the substrate processing system stand by is provided adjacent to a carry-in/out block for the substrate processing system.
Patent Document 1: Japanese Patent Laid-open Publication No. 2009-010287

SUMMARY

In an exemplary embodiment, a substrate processing apparatus configured to process a substrate includes a substrate receptacle placing unit configured to place thereon a substrate receptacle accommodating therein the substrate to be processed in the substrate processing apparatus; and a storage zone provided adjacent to the substrate receptacle placing unit to store therein the substrate receptacle. The substrate receptacle includes multiple substrate receptacles, and the storage zone includes multiple storages which are vertically arranged in multiple levels and configured to place and store thereon the multiple substrate receptacles horizontally. The substrate receptacle is transferred between a first storage of the multiple storages at an uppermost position and a ceiling travelling vehicle configured to be moved above the substrate processing apparatus. A second storage of the multiple storages under the first storage at the uppermost position is configured to place and store the substrate receptacle thereon such that a direction of the substrate receptacle on the second storage is different from a direction of the substrate receptacle placed and stored on the first storage at the uppermost position.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
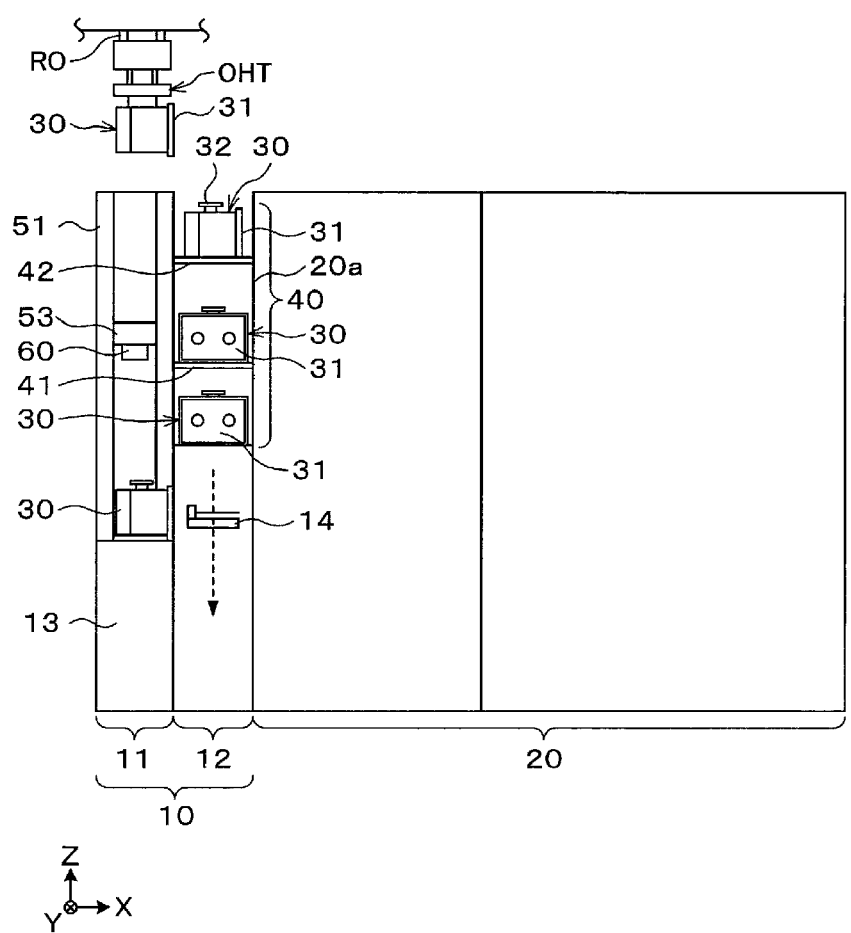
FIG. 1 is a side view schematically illustrating a configuration of a wafer processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First, a configuration of a conventional processing system for a substrate (hereinafter, referred to as a wafer) described in Patent Document 1 will be explained. In the processing system disclosed in Patent Document 1, a cassette storage as a stocker in which multiple cassettes to be carried into/from a carry-in/out block of the processing system are accommodated to stand by is provided adjacent to the carry-in/out block. The cassette storage is typically enclosed by a casing for the control of an atmosphere, and a carry-in/out opening for the cassette is formed at a ceiling surface of the casing. Further, a track for a ceiling travelling vehicle configured to transfer the cassette between apparatuses is provided above the cassette storage, and an inter-apparatus cassette transfer device is configured to carry the cassette into/from a cassette standby block from above it through the carry-in/out opening.

As stated above, the cassette standby block generally called a FEX (FOUP Exchanger) is an apparatus for temporarily stocking therein a multiple number of cassettes (FOUPs), each of which serves as a substrate receptacle accommodating therein a plurality of, for example, twenty five sheets of wafers to be processed in a substrate processing apparatus. By way of example, ten cassettes are stocked within the FEX. Since the FEX has a function of stocking therein the cassettes to be carried into/from the processing system, the FEX is generally disposed adjacent to the carry-in/out block of the processing system, that is, at a front side of the carry-in/out block in the processing system for the substrate described in Patent Document 1, for example.

When the FEX stocks the multiple number of cassettes therein, the cassettes are arranged side by side such that a front side of each cassette, that is, a side of the cassette through which a wafer is carried in or out typically faces the carry-in/out block of the substrate processing apparatus. In such a case, to store a large number of cassettes in the FEX, a size of the FEX needs to be increased.

In view of the foregoing, according to an exemplary embodiment of the present disclosure, a larger number of substrate receptacles can be stored in a storage zone in which the cassettes are stored, as compared to the conventional case.

Hereinafter, a configuration of a wafer processing apparatus as a substrate processing apparatus according to the exemplary embodiment will be described with reference to the accompanying drawings. In the present specification, parts having substantially same functions and configurations will be assigned same reference numerals, and redundant description will be omitted.

Figure 2:
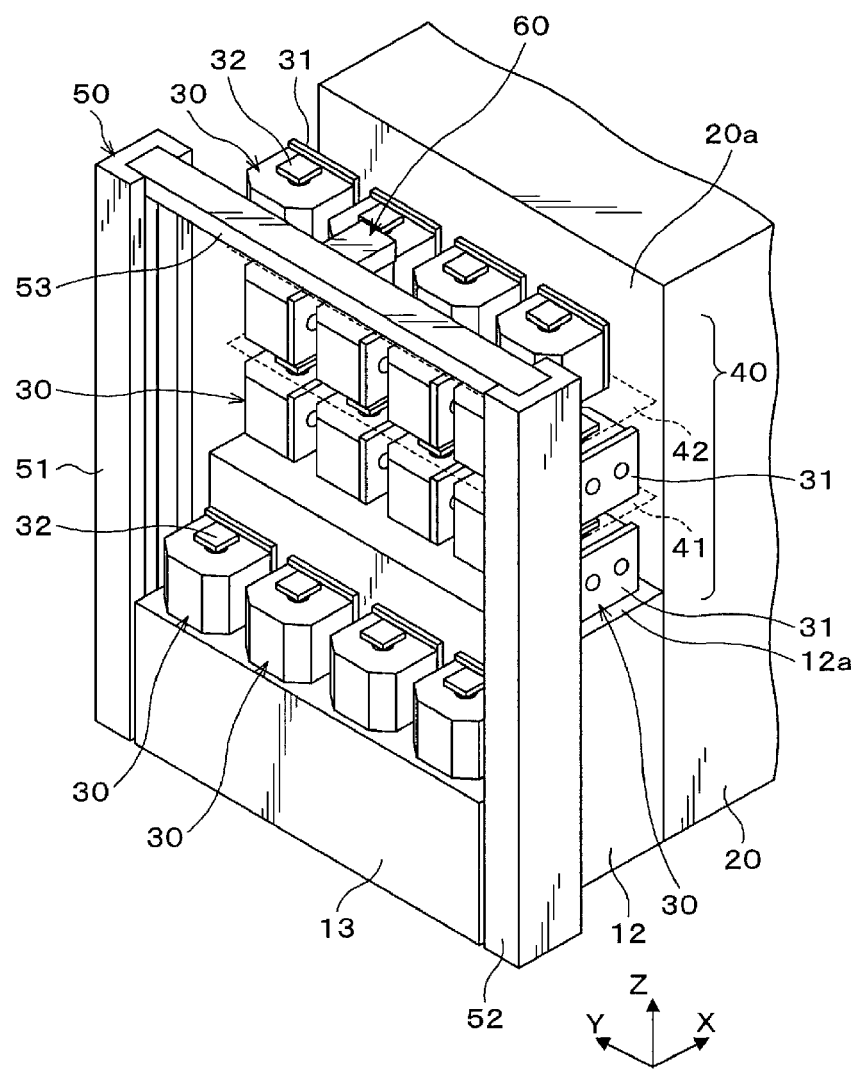
FIG. 2 is a perspective view illustrating a configuration in the vicinity of a carry-in/out unit in the wafer processing apparatus of FIG. 1.

As illustrated in FIG. 1 and FIG. 2, a wafer processing apparatus 1 includes a carry-in/out station 10 configured as a carry-in/out unit for a substrate receptacle (hereinafter, referred to as a cassette) such as FOUP accommodating therein a multiple number of wafers as substrates; and a processing station 20 configured as a processing unit including multiple kinds of processing apparatuses (not shown) configured to perform preset processings on a wafer W. The carry-in/out station 10 and the processing station 20 are connected as a single body.

The carry-in/out station 10 includes a cassette block 11; and a carry-in/out block 12 connected with the cassette block 11 and serving as a carry-in/out unit configured to transfer the wafer between the cassette block 11 and the processing station 20. The cassette block 11 has a cassette placing table 13 which is also called a load port. A plurality of (for example, four in the shown example) cassettes 30 can be placed on the cassette placing table 13 while being arranged in a row in the Y direction.

Within the carry-in/out block 12, there is provided a transfer arm 14 configured to take out a to-be-processed wafer within the cassette C placed on the cassette placing table 13 and transfer the taken wafer to the processing station 20, and, also, transfer a processed wafer in the processing station 20 to the cassette 30 placed on the cassette placing table 13. A height of the carry-in/out block 12 is lower than a height of the processing station 20, and a height of the cassette placing table 13 is lower than the height of the carry-in/out block 12.

A cassette storage zone 40 as a storage region is provided above the carry-in/out block 12. The cassette storage zone 40 is configured to store cassettes 30 in storages vertically arranged in three levels. A lowermost storage 12a is provided on a top surface of the carry-in/out block 12. A middle storage is set on a shelf plate 41, and an uppermost storage is set on a shelf plate 42. These shelf plates 41 and 42 are supported at, for example, a front wall 20a of the processing station 20.

An OHT (Overhead Hoist Transport) as a ceiling travelling vehicle capable of travelling along a transfer path RO elongated in, for example, the Y direction is provided above the cassette placing table 13. The OHT is capable of holding and transferring the cassette 30 to/from another wafer processing apparatus provided at an outside of the wafer processing apparatus 1. Further, the OHT can be lowered to deliver the cassette 30 onto a placing plate 42a of the shelf plate 42 to be described later from above it. As depicted in FIG. 2, the cassette 30 has a front portion 31 through which the wafer is carried in/out; and an engagement member 32 provided on a top surface of the cassette 30 and having a square plate shape when viewed from the top. The OHT is moved along the transfer path RO while holding the engagement member 32 such that the front portion 31 of the cassette 30 faces the processing station 20 of the wafer processing apparatus 1.

Figure 3:
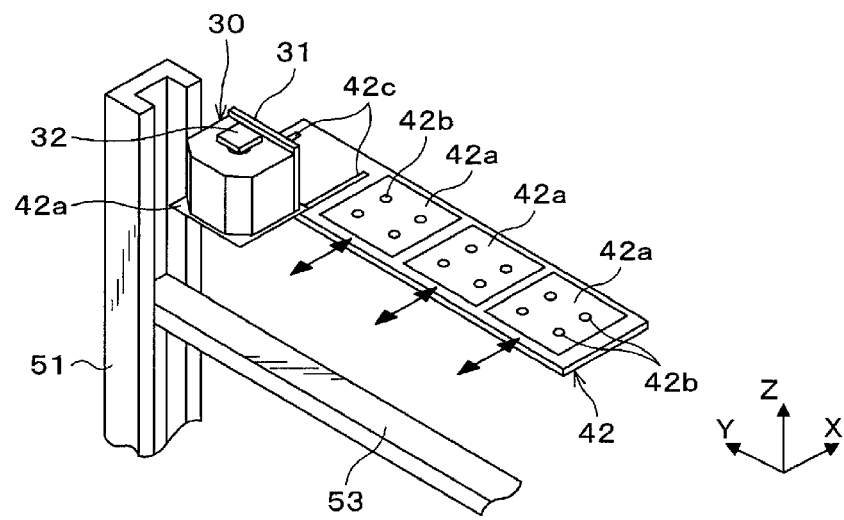
FIG. 3 is a perspective view illustrating an uppermost storage in the wafer processing apparatus of FIG. 1.

The shelf plate 42 configured as the uppermost storage is capable of storing four cassettes 30 thereon such that the four cassettes 30 are arranged side by side in the Y direction, as illustrated in FIG. 3. The cassettes 30 are respectively placed on the placing plates 42a provided on the shelf plate 42. Each placing plate 42a serving as a substrate supporting member is equipped with supporting members 42b configured to support a bottom surface of the cassette 30 directly. The placing plate 42a is slidable in the X direction, as illustrated in FIG. 3. By being moved in the negative X direction, the placing plate 42a is capable of receiving the cassette 30 held by the aforementioned OHT at a position above the cassette placing table 13, and, also, the cassette 30 on the placing plate 42a can be received by the OHT.

As stated above, the shelf plate 42 configured as the uppermost storage allows, like the cassette placing table 13, the cassettes 30 to be placed thereon side by side such that the front portion 31 of each cassette 30 faces the processing station 20.

Figure 4:
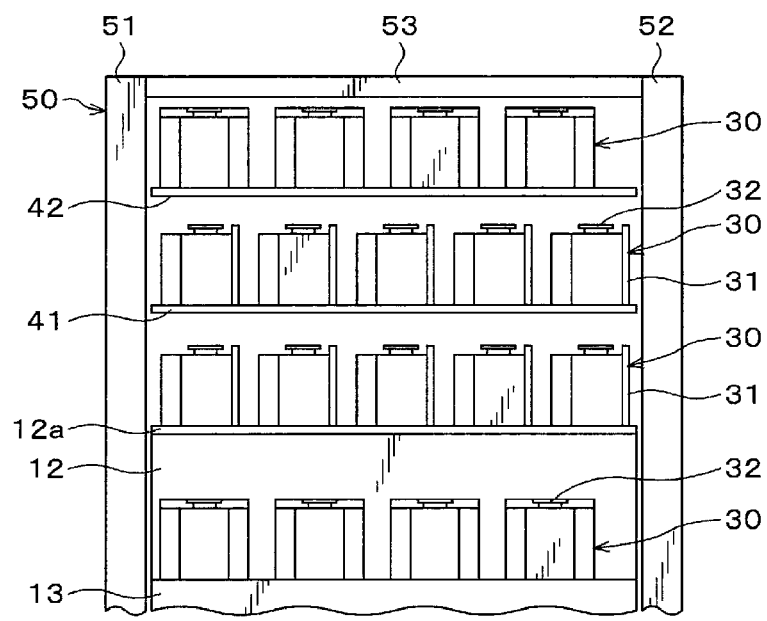
FIG. 4 is a front view of the wafer processing apparatus of FIG. 1.

Meanwhile, the cassettes 30 are placed and stored on the lowermost storage 12a provided on the top surface of the carry-in/out block 12 and the shelf plate 41 as the middle storage to be oriented toward a direction different from the direction of the cassettes 30 placed on the uppermost shelf plate 42, that is, such that the front portion 31 of each cassette 30 is oriented toward the negative Y direction, as illustrated in FIG. 2 and FIG. 4.

Lengths of the shelf plate 41 and the storage 12a in the Y direction are equal to a length of the uppermost shelf plate 42. The cassette 30 of this kind has a depth shorter than a width. Thus, by placing the cassettes 30 such that the front portions 31 thereof are oriented toward the negative Y direction, the number of cassettes that can be placed and stored on each of the shelf plate 41 and the storage 12a becomes larger than the number of the cassettes that can be placed and stored on the uppermost shelf plate 42. In the shown example, five cassettes 30 can be placed and stored on each of the shelf plate 41 and the storage 12a. Thus, as compared to a case where the cassettes 30 are placed such that the front portions 31 thereof face the processing station 20, the same as the cassettes 30 placed on the uppermost shelf plate 42, a larger number of cassettes 30 can be stored on each of the shelf plate 41 and the storage 12a.

In such a case, since the cassette 30 received from the OHT is placed on the uppermost shelf plate 42 such that the front portion 31 thereof faces the processing station 20, the cassette 30 needs to be moved to and placed on the shelf plate 41 or the storage 12a after a direction of the cassette 30 is changed.

Figure 5:
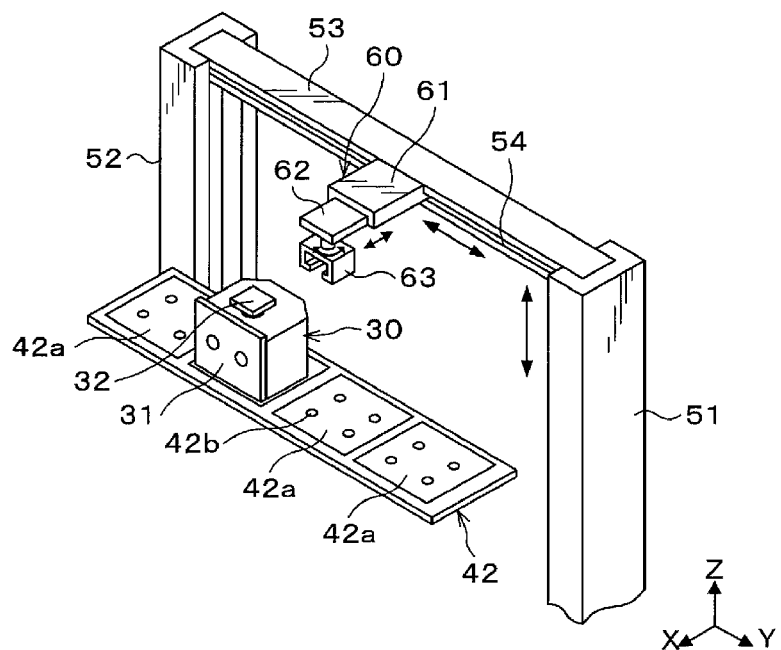
FIG. 5 is a perspective view illustrating a moving/placing device in the wafer processing apparatus of FIG. 1.

In the present exemplary embodiment, this function is carried out by a moving/placing device supporting mechanism 50 and a moving/placing device 60 shown in FIG. 5. That is, as shown in FIG. 2, the moving/placing device supporting mechanism 50 has supporting columns 51 and 52 at both sides of the cassette placing table 13, for example. A moving/placing device supporting member 53 is held between the supporting columns 51 and 52. This moving/placing device supporting member 53 is configured to be moved up and down in the Z direction along the supporting columns 51 and 52 by an appropriate driving mechanism (not shown).

The moving/placing device 60 is configured such that a base portion 61 thereof is moved in an elongated direction of the moving/placing device supporting member 53, that is, in the Y direction by an appropriate driving mechanism (not shown). A sliding body 62 configured to be movable in the X direction by an appropriate driving mechanism (not shown) is provided at the base portion 61. A holder 63 is provided at a bottom side of this sliding body 62 so as to be rotated by an appropriate driving mechanism (not shown). The holder 63 according to the exemplary embodiment is configured to hold the engagement member 32 by gripping the engagement member 32, which is provided on the top surface of the cassette 30, from both sides thereof.

To be more specific, as the sliding body 62 is moved in the positive X direction from a state shown in FIG. 5, for example, the engagement member 32 of the cassette 30 is held by the holder 63. Then, the sliding body 62 is retreated in, for example, the negative X direction, and the direction of the held cassette 30 is changed by rotating the holder 63 with a rotating mechanism. In the present exemplary embodiment, the direction of the cassette 30 can be changed to any direction in 360 degrees.

By using the above-described configuration, the moving/placing device 60 can be moved three-dimensionally, and is capable of rotating the held cassette 30 by at least 90 degrees horizontally with respect to a held position.

Now, in the present exemplary embodiment including the moving/placing device 60 having the above-described configuration, a sequence of moving and placing the cassette 30 will be discussed.

Figure 6:
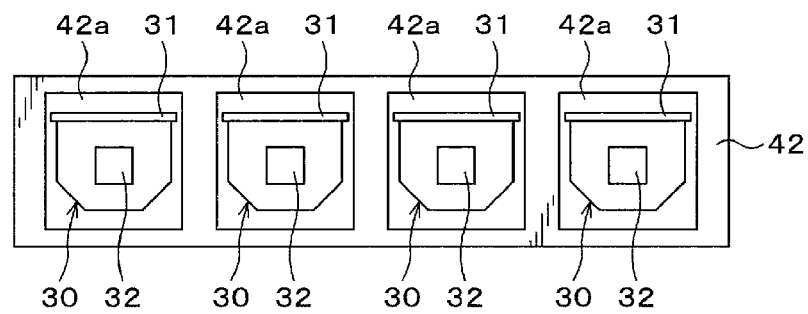
FIG. 6 is a plan view illustrating a storage state of cassettes placed on an uppermost shelf plate in the wafer processing apparatus of FIG. 1.

First, as stated above, the placing plate 42a of the shelf plate 42 as the uppermost storage is slid in the negative X direction and stands by at a receiving position, as illustrated in FIG. 3. The cassette 30 held by the OHT is then lowered down and placed on the placing plate 42a. The placing plate 42a having the cassette 30 thereon is then slid in the positive X direction and returned back to a preset position of the shelf plate 42. By way of example, a plan view of FIG. 6 illustrates a state in which four cassettes 30 are placed on the shelf plate 42.

Figure 7:
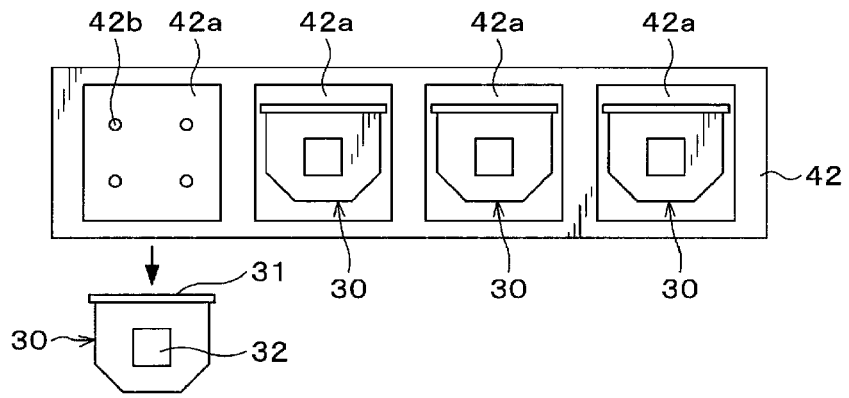
FIG. 7 is a plan view illustrating a state in which one of the cassettes placed on the uppermost shelf plate shown in FIG. 6 is taken out.

Then, the moving/placing device 60 is moved to a position where it can pick the cassette 30, as illustrated in FIG. 5, and the sliding body 62 is moved in the positive X direction to hold the engagement member 32 of the cassette 30. In this state, the moving/placing device 60 is moved upward, and, the sliding body 62 is moved in the negative X direction to thereby retreat the cassette 30 from the shelf plate 42, as illustrated in FIG. 7.

Figure 8:
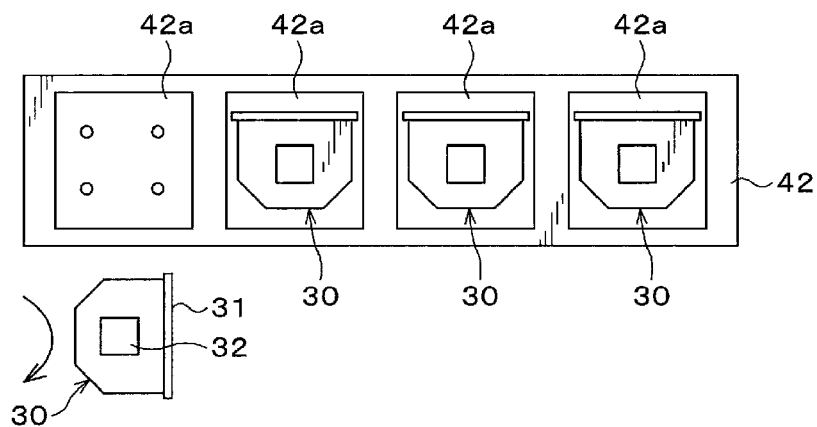
FIG. 8 is a plan view illustrating a state in which a direction of the cassette taken out from the uppermost shelf plate shown in FIG. 7 is changed.

Then, by rotating the holder 63 with the rotating mechanism, the direction of the held cassette 30 can be changed, as shown in FIG. 8. In the example of FIG. 8, the front portion 31 of the cassette 30 is rotated 90 degrees in the clockwise direction.

Figure 9:
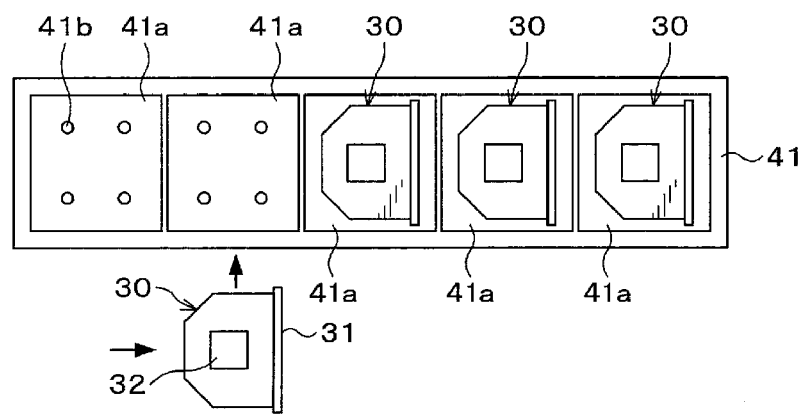
FIG. 9 is a plan view illustrating a state in which the cassette having the changed direction shown in FIG. 8 is being placed on a middle shelf plate.

In this state, the moving/placing device 60 is moved in a Z direction to a position set to be slightly higher than the height of the shelf plate 41 or the storage 12a on which the cassette 30 with the changed direction is to be placed. Further, the base portion 61 is moved in the Y direction to be located at a position where the moving/placing device 60 can place the cassette 30 on the shelf plate 41 or the storage 12a, as depicted in FIG. 9. In the example of FIG. 9, the cassette 30 is supposed to be placed on the middle shelf plate 41. These movements of the moving/placing device 60 in the Z and Y directions may be made at the same time.

Thereafter, the sliding body 62 of the moving/placing device 60 is moved toward the shelf plate 41, thus allowing the held cassette 30 to be placed above the supporting members 41b of the preset placing plate 41a of the shelf plate 41. Then, the moving/placing device 60 is lowered, allowing the cassette 30 to be placed on the supporting members 41b at a preset position. Then, the sliding body 62 is retreated.

Through these movements of the moving/placing device 60, the cassette 30 can be placed and stored on the shelf plate 41 or the storage 12a after the direction thereof is changed.

As stated above, by placing the cassette 30 on the shelf plate 41 or the storage 12a after changing the direction of the cassette 30 to be different from the direction of the cassette on the uppermost shelf plate 42, it is possible to store a larger number of cassettes 30 in the cassette storage zone 40, as compared to the conventional case.

Further, to place the cassette 30, which has been placed with the changed direction, that is, with the front portion 31 thereof being oriented toward the negative Y direction as shown in FIG. 2, onto the cassette placing table 13 after changing the direction of the cassette 30 again, the moving/placing device 60 needs to be moved in the reverse sequence as stated above. That is, the sliding body 62 is advanced toward the cassette 30 placed on the shelf plate 41, and the holder 63 holds the engagement member 32 of the cassette 30. Then, the moving/placing device 60 is raised and then retreated, and the holder 63 is then rotated in the counterclockwise direction to thereby allow the front portion 31 of the held cassette 30 to face the processing station 20. Then, the cassette 30 is placed on a preset position on the cassette placing table 13. When moving the cassette onto the uppermost shelf plate 42, the moving/placing device 60 follows the same sequence.

The configuration of the moving/placing device 60 is not limited to the above-described example. By way of example, the moving/placing device 60 may have any of various configurations as long as it is movable three-dimensionally and is capable of rotating the held cassette 30 horizontally by 90 degrees or more.

Furthermore, in the above-described exemplary embodiment, since the cassette storage zone 40 is provided above the carry-in/out block 12, the large number of cassettes 30 which stand by temporarily can be placed and stored without increasing a footprint of the wafer processing apparatus 1.

Moreover, the transfer arm 14 is provided within the carry-in/out block 12 as stated above. Since the carry-in/out block 12 is typically hermetically closed, dust or particles do not flow between the inside of the carry-in/out block 12 and the cassette storage zone 40 provided above the carry-in/out block 12.

In addition, to maintain the cassette storage zone 40 itself in a clean atmosphere, the whole of the moving/placing device supporting mechanism 50, the moving/placing device 60 and the cassette storage zone 40 need to be covered with a panel or the like, and an opening through which the OHT and the cassette 30 can pass may be formed only at a portion of the panel where the cassette 30 is delivered between the OHT and the uppermost shelf plate 42. Further, a shutter configured to open/close this opening itself may also be provided.

To store an even larger number of cassettes 30, another storage zone which is the same as the cassette storage zone 40 may be provided at an opposite side (negative X direction side) from the processing station 20 with, for example, the moving/placing device supporting mechanism 50 and the moving/placing device 60 therebetween. In this configuration as well, if shelf plates or the like configured to place thereon cassettes 30 having changed directions are vertically provided in multiple levels, a very large number of cassettes 30 can be accommodated and stored, the same as in the cassette storage zone 40. In such a case, since the sliding body 62 of the moving/placing device 60 is movable in the X direction, it can access the cassettes and the shelf plates provided in the another storage zone.

So far, the exemplary embodiments have been described. However, it should be noted that the above-described exemplary embodiments are illustrative in all aspects and are not anyway limiting. The above-described exemplary embodiments may be omitted, replaced and modified in various ways without departing from the scope and the spirit of claims.

Further, the following configuration also belongs to the technical scope of the present disclosure.

(1) A substrate processing apparatus configured to process a substrate, including:

a substrate receptacle placing unit configured to place thereon a substrate receptacle accommodating therein the substrate to be processed in the substrate processing apparatus; and a storage zone provided adjacent to the substrate receptacle placing unit to store therein the substrate receptacle, wherein the substrate receptacle includes multiple substrate receptacles, and the storage zone includes multiple storages which are vertically arranged in multiple levels and configured to place and store thereon the multiple substrate receptacles horizontally, the substrate receptacle is transferred between a first storage of the multiple storages at an uppermost position and a ceiling travelling vehicle configured to be moved above the substrate processing apparatus, and a second storage of the multiple storages under the first storage at the uppermost position is configured to place and store the substrate receptacle thereon such that a direction of the substrate receptacle on the second storage is different from a direction of the substrate receptacle placed and stored on the first storage at the uppermost position.

(2) The substrate processing apparatus as described in (1), further including:

a carry-in/out unit configured to carry the substrate in/out between the substrate receptacle on the substrate receptacle placing unit and a processing unit of the substrate processing apparatus, wherein the storage zone is provided above the carry-in/out unit.

(3) The substrate processing apparatus as described in (1) or (2), wherein the first storage at the uppermost position is equipped with a substrate supporting member configured to be moved between a position, above the substrate receptacle placing unit, where the substrate receptacle is allowed to be delivered with respect to the ceiling travelling vehicle and a position where the substrate receptacle is allowed to be stored.

(4) The substrate processing apparatus as described in (2) or (3), wherein a transfer arm configured to carry the substrate between the substrate receptacle on the substrate receptacle placing unit and the processing unit of the substrate processing apparatus is provided within the carry-in/out unit, and the carry-in/out unit is hermetically sealed with respect to the storage zone.

(5) The substrate processing apparatus as described in any one of (1) to (4), further including:

a moving/placing device configured to move the substrate receptacle between the first storage at the uppermost position, the second storage under the first storage at the uppermost position, and the substrate receptacle placing unit to place the substrate receptacle on the first storage at the uppermost position, the second storage under the first storage at the uppermost position, or the substrate receptacle placing unit, wherein the moving/placing device is equipped with a mechanism configured to change the direction of the substrate receptacle held thereby to a different horizontal direction.

(6) The substrate processing apparatus as described in (5), wherein the moving/placing device is configured to be moved three-dimensionally, and is equipped with a rotating mechanism configured to rotate the held substrate receptacle at least 90 degrees horizontally with respect to a held position.

(7) The substrate processing apparatus as described in (5) or (6), further including:

an additional storage zone configured to store a substrate receptacle therein and provided at a position opposite from the storage zone with the substrate receptacle placing unit therebetween, wherein the moving/placing device is allowed to move the substrate receptacle stored in the additional storage zone to the first storage at the uppermost position and the substrate receptacle placing unit to place the substrate receptacle on the first storage at the uppermost position or the substrate receptacle placing unit.

(8) A substrate receptacle storage method of storing a substrate receptacle accommodating a substrate therein, wherein the substrate receptacle is stored in a storage zone provided adjacent to a substrate receptacle placing unit of a substrate processing apparatus configured to process the substrate, the substrate receptacle includes multiple substrate receptacles, and multiple storages configured to place and store thereon the multiple substrate receptacles horizontally are vertically arranged in multiple levels in the storage zone, the substrate receptacle is transferred between a first storage of the multiple storages at an uppermost position and a ceiling travelling vehicle configured to be moved above the substrate processing apparatus, and the substrate receptacle is placed and stored on a second storage of the multiple storages under the first storage at the uppermost position such that a direction of the substrate receptacle on the second storage is different from a direction of the substrate receptacle placed and stored on the first storage at the uppermost position.

According to the exemplary embodiment, as compared to conventional cases, a larger number of substrate receptacles accommodating substrates therein can be stored in the storages in which the substrate receptacles stand by temporarily.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus configured to process a substrate, comprising:
a substrate receptacle placing unit configured to place thereon a substrate receptacle accommodating therein the substrate to be processed in the substrate processing apparatus; and
a storage zone provided adjacent to the substrate receptacle placing unit to store therein the substrate receptacle,
wherein the substrate receptacle includes multiple substrate receptacles, and the storage zone comprises multiple storages which are vertically arranged in multiple levels and configured to place and store thereon the multiple substrate receptacles horizontally,
the substrate receptacle is transferred between a first storage of the multiple storages at an uppermost position and a ceiling travelling vehicle configured to be moved above the substrate processing apparatus,
a second storage of the multiple storages under the first storage at the uppermost position is configured to place and store the substrate receptacle thereon such that a direction of the substrate receptacle on the second storage is different from a direction of the substrate receptacle placed and stored on the first storage at the uppermost position,
the first storage has a first shelf plate and the second storage has a second shelf plate,
the first and second shelf plates have the same length, and
a number of substrate receptacles placed on the second shelf plate is larger than a number of substrate receptacles placed on the first shelf plate.

2. The substrate processing apparatus of claim 1, further comprising:
a carry-in/out unit configured to carry the substrate in/out between the substrate receptacle on the substrate receptacle placing unit and a processing unit of the substrate processing apparatus,
wherein the storage zone is provided above the carry-in/out unit.

3. The substrate processing apparatus of claim 1,
wherein the first storage at the uppermost position is equipped with a substrate supporting member configured to be moved between a position, above the substrate receptacle placing unit, where the substrate receptacle is allowed to be delivered with respect to the ceiling travelling vehicle and a position where the substrate receptacle is allowed to be stored.

4. The substrate processing apparatus of claim 2,
wherein a transfer arm configured to carry the substrate between the substrate receptacle on the substrate receptacle placing unit and the processing unit of the substrate processing apparatus is provided within the carry-in/out unit, and
the carry-in/out unit is hermetically sealed with respect to the storage zone.

5. The substrate processing apparatus of claim 1, further comprising:
a moving/placing device configured to move the substrate receptacle between the first storage at the uppermost position, the second storage under the first storage at the uppermost position, and the substrate receptacle placing unit to place the substrate receptacle on the first storage at the uppermost position, the second storage under the first storage at the uppermost position, or the substrate receptacle placing unit,
wherein the moving/placing device is equipped with a mechanism configured to change the direction of the substrate receptacle held thereby to a different horizontal direction.

6. The substrate processing apparatus of claim 5,
wherein the moving/placing device is configured to be moved three-dimensionally, and is equipped with a rotating mechanism configured to rotate the held substrate receptacle at least 90 degrees horizontally with respect to a held position.

7. The substrate processing apparatus of claim 5, further comprising:
an additional storage zone configured to store a substrate receptacle therein and provided at a position opposite from the storage zone with the substrate receptacle placing unit therebetween,
wherein the moving/placing device is allowed to move the substrate receptacle stored in the additional storage zone to the first storage at the uppermost position and the substrate receptacle placing unit to place the substrate receptacle on the first storage at the uppermost position or the substrate receptacle placing unit.

8. A substrate receptacle storage method of storing a substrate receptacle accommodating a substrate therein,
wherein the substrate receptacle is stored in a storage zone provided adjacent to a substrate receptacle placing unit of a substrate processing apparatus configured to process the substrate,
the substrate receptacle includes multiple substrate receptacles, and multiple storages configured to place and store thereon the multiple substrate receptacles horizontally are vertically arranged in multiple levels in the storage zone,
the substrate receptacle is transferred between a first storage of the multiple storages at an uppermost position and a ceiling travelling vehicle configured to be moved above the substrate processing apparatus,
the substrate receptacle is placed and stored on a second storage of the multiple storages under the first storage at the uppermost position such that a direction of the substrate receptacle on the second storage is different from a direction of the substrate receptacle placed and stored on the first storage at the uppermost position,
the first storage has a first shelf plate and the second storage has a second shelf plate,
the first and second shelf plates have the same length, and
a number of substrate receptacles placed on the second shelf plate is larger than a number of substrate receptacles placed on the first shelf plate.

9. The substrate processing apparatus of claim 1, further comprising:
a processing unit configured to process the substrate; and
a carry-in/out unit configured to transfer the substrate between the substrate receptacles placed on the substrate receptacle placing unit,
wherein the first storage and the second storage are provided above the carry-in/out unit.

10. The substrate receptacle storage method of claim 8,
wherein a processing unit is configured to process the substrate, a carry-in/out unit is configured to transfer the substrate between the substrate receptacles placed on the substrate receptacle placing unit, and the first storage and the second storage are provided above the carry-in/out unit.

11. A substrate processing apparatus configured to process a substrate, comprising:
- a substrate receptacle placing unit configured to place thereon a substrate receptacle accommodating therein the substrate to be processed in the substrate processing apparatus;
- a processing unit configured to process the substrate;
- a carry-in/out unit configured to transfer the substrate between the substrate receptacles placed on the substrate receptacle placing unit; and
- a storage zone provided adjacent to the substrate receptacle placing unit to store therein the substrate receptacle, wherein the substrate receptacle includes multiple substrate receptacles, and the storage zone comprises multiple storages which are vertically arranged in multiple levels and configured to place and store thereon the multiple substrate receptacles horizontally, the substrate receptacle is transferred between a first storage of the multiple storages at an uppermost position and a ceiling travelling vehicle configured to be moved above the substrate processing apparatus, a second storage of the multiple storages under the first storage at the uppermost position is configured to place and store the substrate receptacle thereon such that a direction of the substrate receptacle on the second storage is different from a direction of the substrate receptacle placed and stored on the first storage at the uppermost position, and the first storage and the second storage are provided above the carry-in/out unit.

12. The substrate processing apparatus of claim 11,
wherein the first storage has a first shelf plate and the second storage has a second shelf plate,
the first and second shelf plates have the same length, and
a number of substrate receptacles placed on the second shelf plate is larger than a number of substrate receptacles placed on the first shelf plate.

* * * * *